(12) United States Patent
Wood et al.

(10) Patent No.: US 7,257,173 B2
(45) Date of Patent: Aug. 14, 2007

(54) BOUNDING BOX SIGNAL DETECTOR

(75) Inventors: Glenn Wood, Colorado Springs, CO (US); David D. Eskeldson, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 729 days.

(21) Appl. No.: 10/834,678

(22) Filed: Apr. 28, 2004

(65) Prior Publication Data
US 2005/0243905 A1 Nov. 3, 2005

(51) Int. Cl.
H03D 1/00 (2006.01)
(52) U.S. Cl. ............ 375/342; 375/346; 375/360; 375/226; 375/227
(58) Field of Classification Search .......... 375/226, 375/227, 254, 342, 360
See application file for complete search history.

(56) References Cited

U.S. PATENT DOCUMENTS 6,272,177 B1 * 8/2001 Murakami et al. ..... 375/240.03
6,744,813 B1 * 6/2004 Ko et al. .............. 375/224

* cited by examiner

Primary Examiner—Kevin Kim

(57) ABSTRACT

A description of signal behavior in the vicinity of a time and voltage of interest is produced by defining a region in the (time, voltage) plane that is a closed straight sided figure whose vertices are identified by threshold crossings offset for the voltage of interest and clocked by time delays offset from a clock time of interest. A first set of latches clocked by the time delays accumulates the state of signal behavior relative to the threshold voltages as it occurs, and their contents are subsequently transferred to a second set of latches at the start of a new clock cycle, allowing a new accumulation to begin and also allowing a detection logic circuit to operate on a unified and completed collection of indicators of what the just concluded description amounts to. The detection logic circuit responds to the combinations of latched indications to produce a signal corresponding to that description. The closed figure need not be a rectangle, and it may also serve as an indication that a signal went into a region that it should not have, e.g., an eye violation detector.

12 Claims, 7 Drawing Sheets

FOUR POINT BOUNDING BOX DETECTOR

FOR SWEPT DATA CHANNEL DELAY

FOUR POINT BOUNDING BOX DETECTOR

75  POSSIBLE DETECTION LOGIC OUTCOMES

| A | B | C | D | D_IN BEHAVIOR |
|---|---|---|---|---|
| 0 | 0 | 0 | 0 | D_IN IS LOW |
| 0 | 0 | 0 | 1 | IMPOSSIBLE |
| 0 | 0 | 1 | 0 | IMPOSSIBLE |
| 0 | 0 | 1 | 1 | IMPOSSIBLE |
| 0 | 1 | 0 | 0 | RISING D_IN (R1) |
| 0 | 1 | 0 | 1 | RISING D_IN (R2) |
| 0 | 1 | 1 | 0 | IMPOSSIBLE |
| 0 | 1 | 1 | 1 | IMPOSSIBLE |
| 1 | 0 | 0 | 0 | FALLING D_IN (F1) |
| 1 | 0 | 0 | 1 | IMPOSSIBLE |
| 1 | 0 | 1 | 0 | FALLING D_IN (F2) |
| 1 | 0 | 1 | 1 | IMPOSSIBLE |
| 1 | 1 | 0 | 0 | D_IN IS QUIET |
| 1 | 1 | 0 | 1 | RISING D_IN (R3) |
| 1 | 1 | 1 | 0 | FALLING D_IN (F3) |
| 1 | 1 | 1 | 1 | D_IN IS HIGH |

FIG. 6

SIX POINT BOUNDING BOX DETECTOR

BOUNDING BOX SIGNAL DETECTOR

BACKGROUND OF THE INVENTION

There are many types of electronic test equipment whose operation includes the digital acquisition of a series of analog voltage values. In some cases, such as in real time digital oscillography, an acquisition record is required for a large number of consecutive samples taken in rapid succession. These types of applications generally require a high speed ADC (Analog to Digital Converter), and are typically very expensive to implement. There are other kinds of related applications where a significantly lower cost is desired, which can be achieved if certain performance requirements can be relaxed. These other applications often take advantage of an expected periodicity wherein the signal's previous behavior is repeated, and given enough time a complete description of the signal can be created by sampling different locations within that behavior during successive instances of the behavior. This can remove the need for sustained high speed operation from the ADC. Some digital oscilloscopes operate in this mode. There is yet another variation on this latter mode, where the signal behavior is not required or expected to repeat its exact waveform during the successive instances of sampling at different locations. For example, an EDA (Eye Diagram Analyzer) is more interested in the locations of edges, their rise and fall times and their exerted voltage levels between transitions, rather than in the particular waveform as a voltage history versus time. EDAs often acquire data for large number of signals at the same time (e.g., for all the signals in a wide bus). It is economically impractical to use an expensive data acquisition technique that might be justifiable for two or four channels in a digital oscilloscope for all sixty-four or one hundred twenty-eight channels of an EDA. Accordingly, there have been developed for such applications various ways to lower the cost of the per-channel data acquisition hardware. These techniques often rely on combinations of delay elements and threshold comparators to produce indications that a certain combination of signal parameters was observed. The occurrence (or lack thereof) is noted, the parameters changed, and the process continued.

For example, U.S. patent application Ser. No. 10/629,269 entitled IMPROVED EYE DIAGRAM ANALYZER CORRECTLY SAMPLES LOW dv/dt VOLTAGES filed 29 Jul. 2003 by David D. Eskeldson and Richard A. Nygaard JR. describes various arrangements of adjustable delay elements and adjustable threshold detectors that indicate, relative to a reference point in time (such as the edge of a clock signal), if a signal of interest within an SUT (System Under Test) exhibited different relationships to the thresholds at closely spaced points in time that are ΔT apart. If it did not, then that negative piece of information (in isolation, anyway) does not tell us much about where the signal was, but if there WERE different relationships exhibited, then we know within certain time and voltage resolutions that the signal was within or passed through a region described by the thresholds and the delays involved. Such detection is termed a "HIT." It is customary for an ordinate or vertical dimension to represent voltage, while an abscissa or horizontal dimension represents time. In the case of an EDA built around these types of detectors, the region is left to dwell for a certain length of time, the number of HITs recorded in a data structure whose locations correspond to values along the time and voltage axes, and then the region is moved to an adjacent or other selected location in the (time, voltage) plane. The moving of the region can be accomplished through either sweeping the data channel delay or sweeping the clock channel delay. In due course there is enough information amassed to construct an eye diagram from the numbers of HITs recorded in the various locations of the data structure. The eye diagram is depicted as a graph drawn in the (time, voltage) plane.

The prior art (time, voltage) detection mechanisms described in IMPROVED EYE DIAGRAM ANALYZER CORRECTLY SAMPLES LOW dv/dt VOLTAGES are of interest as a point of departure. We now indulge in an extremely abbreviated discussion of those techniques.

Refer now to FIG. 1, wherein is shown a simplified block diagram 11 for a swept data channel delay (time, voltage) detection technique usable in an EDA. FIG. 2 is a simplified block diagram 12 of a similar swept clock channel delay technique. It will be noted that they both use the same mechanism to sample data channel voltage. Wit reference to diagram 47, we could say that the signal of interest must have crossed a horizontal line segment (A to B) at the voltage of the threshold and whose length is the time difference ΔT (we also keep track of where ΔT starts).

In particular, note that in FIG. 1 a variable SWEPT DATA SIGNAL DELAY 10 produces a voltage-compared data channel signal 2 that has been delayed by a variable amount according to what amount of delay in a cycle of swept amounts of delay is currently in effect. The signal 2 is applied to a D input of a latch 3 (A) that is clocked by a clock signal 1, that while it has been delayed by a CONFIGURABLE CLOCK TRIM DELAY mechanism 9, may be thought of as being "the SUT clock". The voltage-compared data channel signal 2 is also applied to the D input of another latch 4 (B) that is clocked by a slightly delayed (by dt DELAY) version of the clock signal 1. The idea is that if the SUT data signal for that channel passed through the comparison threshold at a time corresponding to the current SWEPT DATA SIGNAL DELAY, then the two latches 3 and 4 will capture different values, which condition is detected by XOR gate 6 and used to increment a # OF HITS COUNTER 7. We call this mechanism a TRANSITION DETECTOR (8), and say that a HIT occurs when the SUT data signal crosses the voltage described by the horizontal line segment A to B (during ΔT).

In FIG. 2 there is a block diagram 12 of the swept clock channel delay technique, which, it will be appreciated from the figure, has the same TRANSITION DETECTOR (8). In fact, the block diagrams 11 and 12 are seemingly identical, although they operate in different manners. What used to be a CLOCK TRIM DELAY 9 in FIG. 1 is now operated as SWEPT CLOCK DELAY 13 in FIG. 2, and what used to be SWEPT DATA SIGNAL DELAY 10 in FIG. 1 is now operated as DATA SIGNAL DE_SKEW DELAY 14.

With both of the techniques of FIGS. 1 and 2 the reliance on detecting a transition through a certain threshold to decide upon a signal value at the time of sampling remains open to failure to detect a HIT when the signal voltage does not aggressively transition at the time of the sample. The basic voltage sampling mechanism relies somewhat on noise in the signal and uncertainty in the comparator to cause HITs along the top (exerted/not exerted) and baseline (not exerted/exerted) signal values. A perfectly clean noise-free signal having no dv/dt between its rise and fall, combined with an ideal comparator, would produce no HITs except during the rise and fall. So we have a situation where, if the SUT's signals are really quite good and the measurement hardware is also really quite good, then the eye diagram goes away except at the transitions; it would seem that better is worse!

So far, nobody's equipment is quite that good, but the notion of "better is worse" is a disgusting situation that motivates the improvements described in connection with FIGS. 3 and 4.

Refer now to FIG. 3, wherein is shown a simplified block diagram 16 of an improvement to the above-described TRANSITION DETECTOR 8 that tolerates low dv/dt. It involves the use of a second threshold comparison, and produces a result that could be described as the OR of crossing the above-described horizontal line segment (A to B) with the condition that the signal fell within or crossed a vertical line segment (A to C) located a one end of the horizontal line segment. These line segments are depicted in the diagram 48. In FIG. 3 the architecture shown is for swept data channel delay.

A conditioned SUT data channel signal 17 is applied to a COMPARATOR 19 that also receives a DATA THRESHOLD voltage 20. The logical output signal from the COMPARATOR 19 is applied through an adjustable DELAY 23 (the SWEPT part of this architecture arises from varying the adjustable delay) to the D inputs of LATCHES 27 (A) and 35 (B). (It will be appreciated that the various adjustable delay elements shown can be tapped sequences of buffers in series.)

A conditioned SUT CLOCK IN signal 29 is applied to another COMPARATOR 30 that receives a CLOCK THRESHOLD voltage 31. The logical output of the COMPARATOR 30 is applied through a CLOCK TRIM DELAY 32 (that is typically set and then left alone) as a clocking signal 33 to the LATCH 27, and via an additional DELAY 34 to LATCH 35. DELAY 34 corresponds to the dt DELAY 5 of FIGS. 1 and 2, and the two LATCHES 27 and 35 of FIG. 3 to LATCHES 3 and 4, respectively (for either of FIGS. 1 and 2). XOR gate 38 of FIG. 3 serves the same purpose as XOR gate 6 of FIGS. 1 and 2, and to this point we have described much of the same basic structure as the TRANSITION DETECTOR 8 of FIGS. 1 and 2. That is, if the DATA IN signal 17 experiences a transition through the threshold 20 during a period of time occupied by DELAY 34, as located by DELAY 23, then the two latches 27 and 35 will have different values, and the exerted output from XOR gate 38 will pass through OR gate 39 to set LATCH 40 and produce a signal HIT 41 that is then used in various ways by the balance of the EDA, and that do not concern us here.

Now note that the DATA IN signal 17 is also applied to a second COMPARATOR 18 whose threshold 22 is different from the DATA THRESHOLD 20 by an amount set by an OFFSET VOLTAGE 21. The logical output from COMPARATOR 18 is applied through DELAY 24 (which preferably tracks DELAY 23, save that it may be offset to compensate channel-to-channel skew) as signal 26 to the D input of LATCH 28 (C) that is clocked by signal 33. A moment's consideration will confirm that if the DATA IN signal 17 is, at the time located by the DELAY 32 (i.e., clocked by signal 33), of a value that is within the (signed) OFFSET VOLTAGE 21 from the DATA THRESHOLD 20, then the two LATCHES 28 and 27 will have different values after being clocked by signal 33. As a particular example when the OFFSET value 21 is positive, LATCH 27 will be set, and LATCH 28 will not be set. The underlying implication that may be drawn is that the level (voltage value at the time of sampling) of the SUT data signal of interest is close (within the OFFSET value 21) to the value of the DATA THRESHOLD 20. On the other hand, if the SUT data signal level is safely on one side of the DATA THRESHOLD 20 by an amount exceeding the OFFSET 21, then both LATCHES 27 and 28 will be set, while in the other case (voltage level on the "other side") neither LATCH will be set. In either case, they (27, 28) are both the same after being clocked by signal 33. However, as noted, in the case of interest (which is a HIT), the LATCHES will be different, and XOR gate 37 will detect such and OR gate 39 will merge this HIT indication with the output of XOR gate 38. The merged result is applied to LATCH 40, from whence things proceed as usual, save that we are now able to detect HITs that may have eluded the TRANSITION DETECTOR 8 of FIGS. 1 and 2. We call this improved mechanism a TRANSITION/RANGE DETECTOR, and say that it detects a HIT when either the SUT data signal crosses the voltage described by the horizontal line segment A to B (during ΔT), or when the SUT signal lies within the voltage range A to C at the start of ΔT, or perhaps (and which is equivalent, but requires slightly different circuitry) lies within the voltage range B to C at the end of ΔT.

Lastly, note optional DELAY 36. If there were no such DELAY 36 then the LATCH 40 captures the results for a cycle of CLOCK IN 31 that is one cycle advanced ahead of the present cycle. In a pipelined system this is not a major shortcoming, as things are later aligned by pipeline delays, anyway. If the delay is present, and chosen to be more than DELAY 34 and less than a clock cycle, then "newest" results are clocked into LATCH 41.

A brief reference to FIG. 4 will reveal a simplified block diagram 45 that is as similar to the block diagram 16 of FIG. 3 as FIG. 2 is similar to FIG. 1. The operation of the circuit is essentially the same as described for FIG. 3, save that the DELAYs 43 and 44 produce a TRIM DELAY that de-skews the data channels, and DELAY 42 operates as a SWEPT CLOCK DELAY.

It is not so much that the above-described systems do not work—they do. But we can imagine other circumstances where we would like more than a simple "it was present" or "it was absent" type of indication for our efforts. For example: "Did it pass all the way through the region, and if so, in which direction?" We might even prefer that the region involved be something other than a line segment or two line segments. But on the other hand, we are mindful that however we choose to augment the acquisition circuitry, we are bound to do it for all sixty-four or one hundred twenty-eight channels, which is a powerful incentive in favor of techniques that return significant amounts of information for relatively little additional hardware. What to do?

SUMMARY OF THE INVENTION

A more informative description of a signal's behavior in the vicinity of a time relative to a transition in a clock and at a voltage of interest can be produced by defining a region in the (time, voltage) plane that is a closed straight sided figure whose vertices are identified by threshold crossings offset for the voltage of interest and clocked by time delays offset from the clock time of interest. A first set of latches clocked by the time delays accumulates the state of the signal's behavior relative to the threshold voltages as it occurs, and their contents are subsequently transferred to a second set of latches at the start of a new clock cycle, allowing a new accumulation to begin and also allowing a detection logic circui to operate on a unified and complete collection of indicators of what the just concluded description amounts to. The detection logic circuit, which may be combinatorial logic or a look-up table, responds to the combinations of latched indications to produce a signal corresponding to that description. The closed figure need not be a rectangle, and its use need not be limited to findinf the particular manner in which a signal traversed its interior, but may also serve as an indication that a signal went into a region that it should not have, e.g., as an eye violation detector.

BRIEF DESCRIPTION OF THE DRAWINGS

FIG. 6 is a chart illustrating an aspect of the operation of the block diagram of FIG. 4.

DESCRIPTION OF A PREFERRED EMBODIMENT

Figure 1:
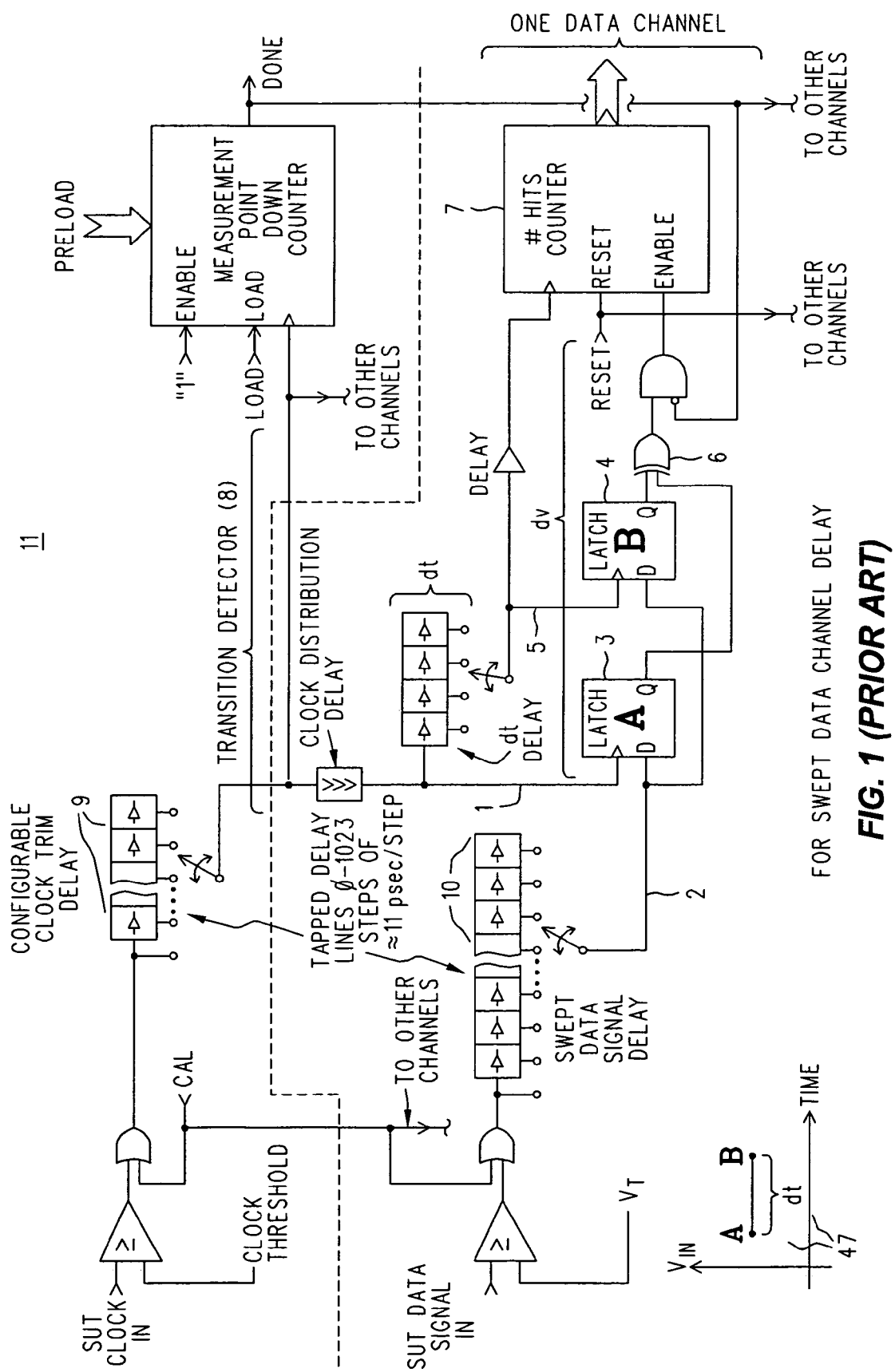
FIG. 1 is a simplified block diagram of a prior art TRANSITION DETECTOR for an eye diagram analyzer that uses swept data channel delay.
Figure 2:
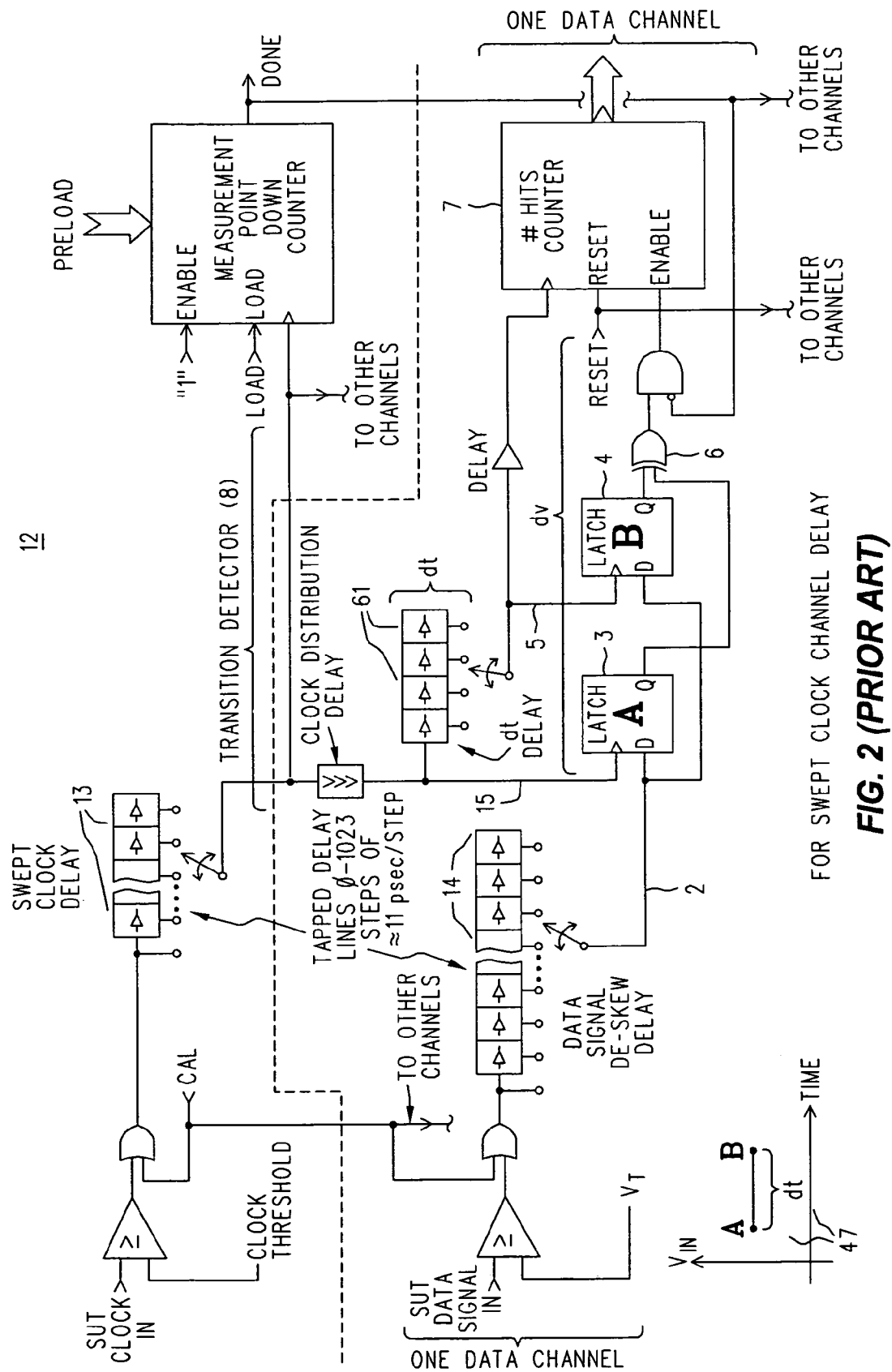
FIG. 2 is a simplified block diagram of a prior art TRANSITION DETECTOR for an eye diagram analyzer that uses swept clock channel delay.
Figure 3:
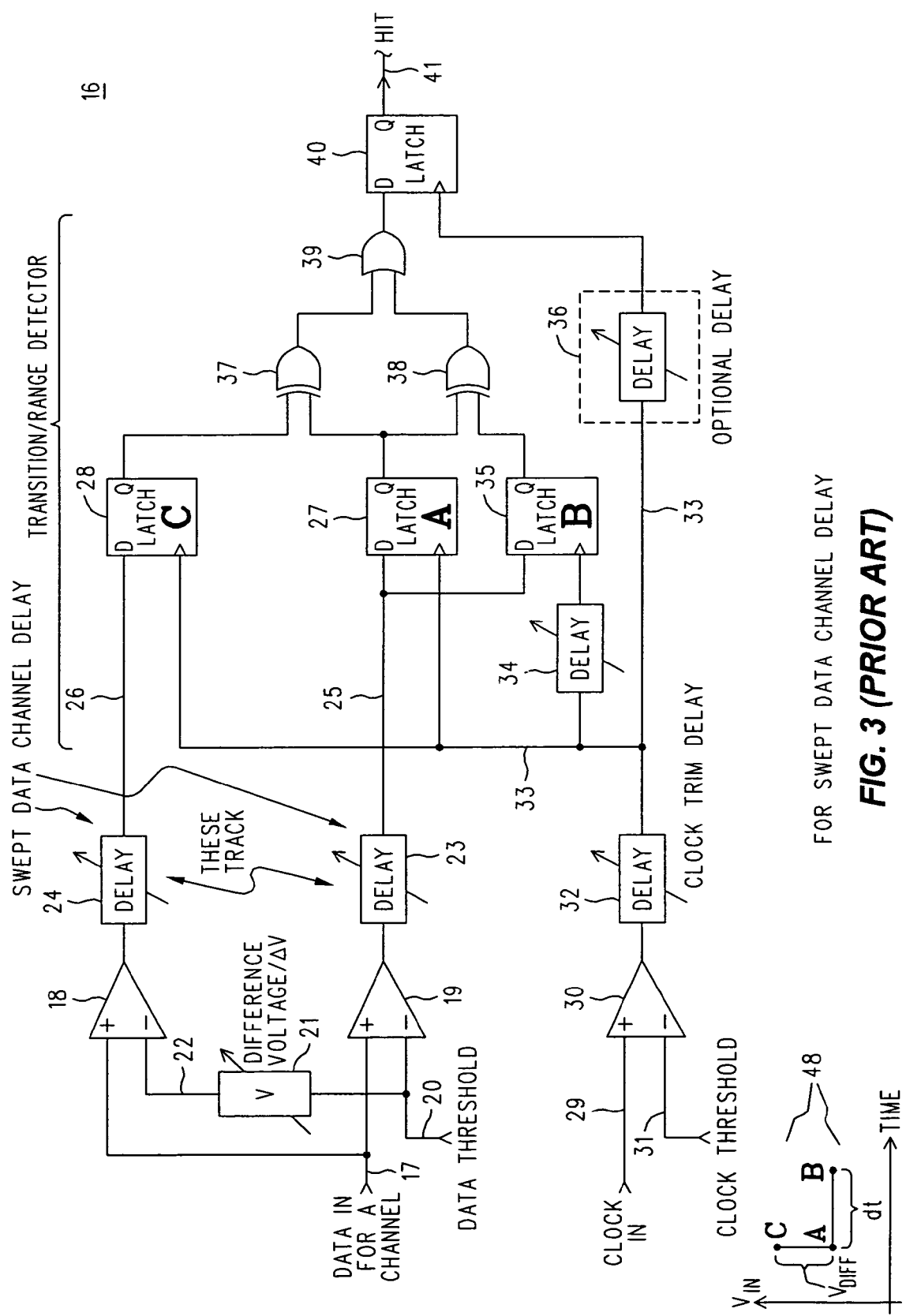
FIG. 3 is a simplified block diagram of a prior art TRANSITION/RANGE DETECTOR for an eye diagram analyzer using swept data channel delay.
Figure 4:
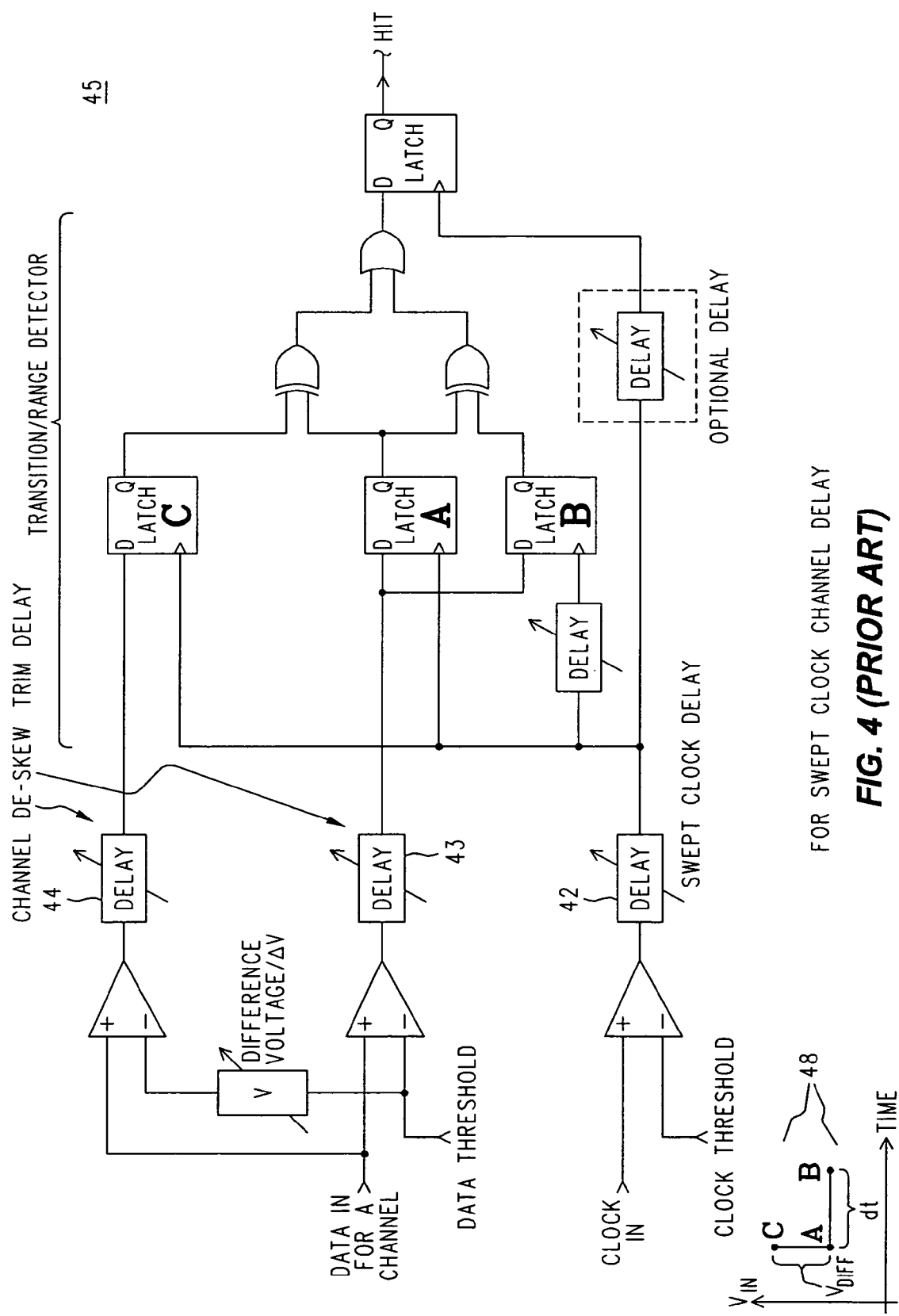
FIG. 4 is a simplified block diagram of a prior art TRANSITION/RANGE DETECTOR for an eye diagram analyzer using swept clock delay.
Figure 5:
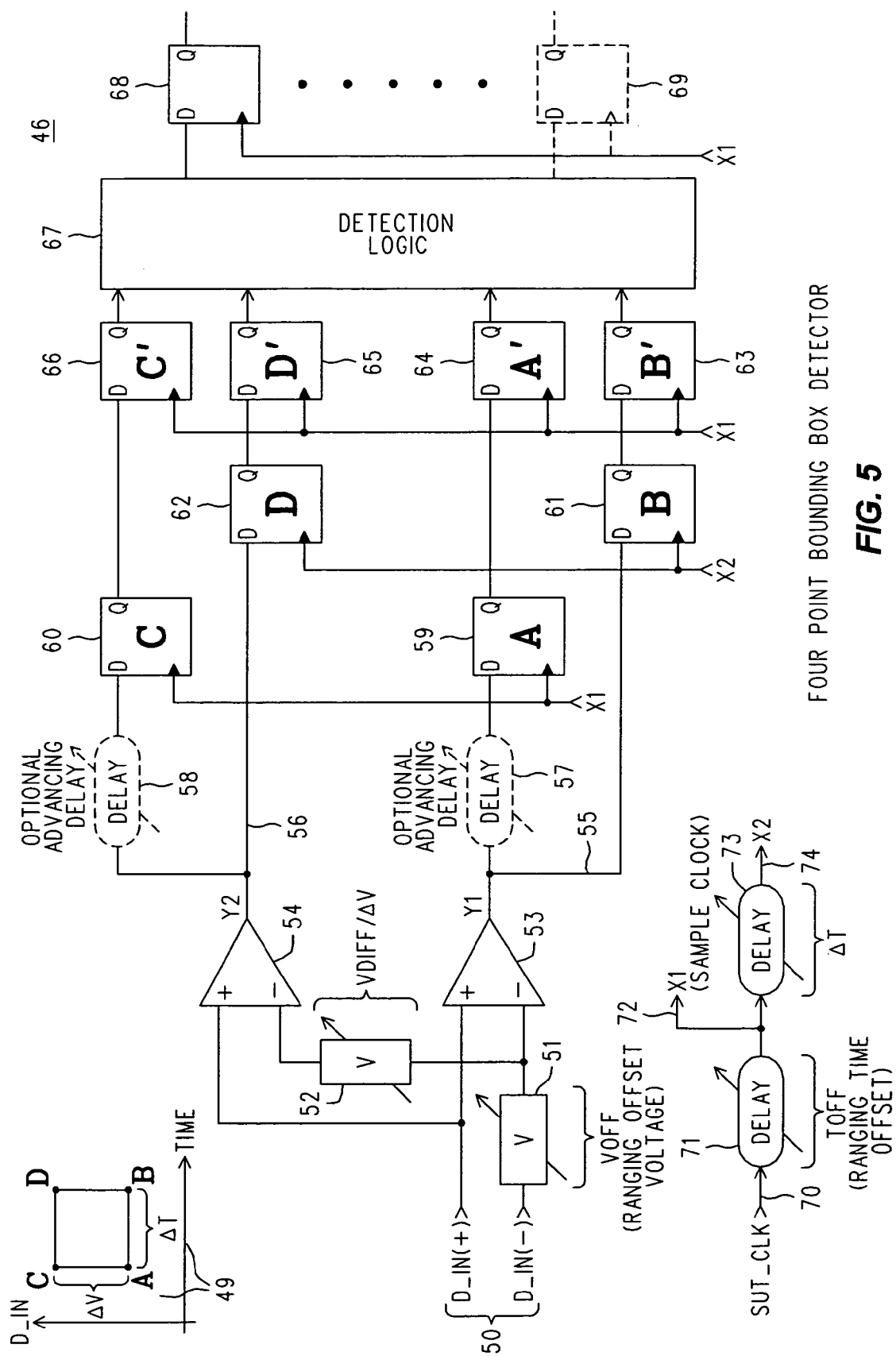
FIG. 5 is a simplified block diagram of a four point BOUNDING BOX DETECTOR constructed in accordance with the principles of the invention.

We turn now to FIG. 5, wherein is depicted a simplified block diagram 46 of what we shall term a four point BOUNDING BOX DETECTOR. Diagram 49 in the upper left-hand corner of the figure illustrates, in general, one kind of four point BOUNDING BOX, which in this case is defined by the four vertices labeled A, B, C and D. Each vertex represents a particular combination of a threshold being met at a certain time. So, A and B have the same threshold voltage (which will be VOFF in this case), but are ΔT apart in time.

A signal X1 (72) is produced by a VARIABLE DELAY 71 applied to SUT_CLK 70, and is delayed from SUT_CLK by a ranging time offset we term TOFF. X1 is the start of a time interval we call ΔT and that is delimited by another signal X2 (74). X2 is produced from X1 by another VARIABLE DELAY 73. It will be appreciated that the VARIABLE DELAY circuits can be, for example, a tapped series of buffers.

We can see how this works by noticing that the input signal 50, which in this case is illustrated as being a differential pair D_IN(+) and D_IN(−), is applied to a COMPARATOR 53 whose output 55 we shall call Y1. The comparison also involves a ranging offset voltage VOFF in series with D_IN(−). By varying VOFF we can make Y1 be a function of any desired voltage level.

Relative to a clock signal from the system under test (SUT_CLK 70) a VARIABLE DELAY circuit 71 produces a signal X1. Ignoring the optional ADVANCING DELAYS 57 and 58, a LATCH A 59 clocked by X1 and capturing Y1 records if the input signal 50 exceeds VOFF at X1.

VOFF is one end of a voltage range called ΔV, whose other end is obtained by a voltage source 52 referenced to the (−) input of COMPARATOR 53. The combined offset of VOFF and ΔV is applied to the (−) input of COMPARATOR 54, whose output 56 we term Y2. Ignoring the OPTIONAL ADVANCING delays 57 and 58, a LATCH C 60 clocked by X1 and capturing Y2 records if the input signal 50 exceeds VOFF+ΔV at X1.

After a moment's reflection, the reader will appreciate that after X1, certain combinations of A and C have useful meanings. For example, A AND NOT C can be interpreted as the voltage value of D_IN lying between the two thresholds represented by Y1 and Y2 at time X1, which is to say, along the line AC in diagram 49.

In like fashion the circuit captures with LATCHES B 61 and D 62 the values of Y1 and Y2 at time X2 (74).

Upon the next instance of X1 the four values for A, B, C and D are clocked into a second set of LATCHES A' (63), B' (64), C' (65) and D' (66). Now these values are one clock signal behind reality, but we have all four at the same time and one whole clock cycle to decide what their combination means. This partial cycle latency may be too slow for certain applications, but it is by no means too slow for all, and is certainly fast enough for, say, use in an EDA. Accordingly, the values of the four LATCHES A' (63), B' (64), C' (65) and D' (66) are applied to a DETECTION LOGIC circuit 67, which produces outputs indicative of useful combinations of those LATCHES. Those indicated combinations are latched upon the next X1 into corresponding LATCHES 68 and 69, whereupon they are noticed and operated upon by some system (not shown, but which might be part of an EDA) that is interested in that sort of thing. It will also be appreciated that line BD is similar to line AC, except that it is for the end of ΔT, where AC is for the start of ΔT.

Furthermore, just as we enquired about combinations of A and C, we can do the same for B and D, and also for the entire collection of A and B and C and D. For example, if we observe A AND NOT B then we have good reason to believe that D_IN was falling and crossed the line AB during ΔT. However, since we have in this case four particular terms to consider, a little thought will confirm that not all combinations are possible for these particular terms. For example, it is not logical that the input voltage can be both above and below the same threshold voltage at the same time. Hence, any combination including C AND NOT A is suspect. FIG. 6 contains a chart 75 that indicates the circumstances for each of the sixteen possibilities for the four terms A, B, C and D of FIG. 5. The DETECTION LOGIC that implements the chart 75 (or a different one for a different application) can be a collection of gates performing combinatorial logic, or, when the number of inputs is high, perhaps a look-up table implemented by a small ROM.

It will be appreciated that A and B (or A' and B') represent the same voltage VOFF at time ΔT apart, starting at TOFF, that C and D (or C' and D') represent the same voltage VOFF+ΔV at time ΔT apart, starting at TOFF, and that these conditions are represented in the diagram 49 by the line segments AB and CD, respectively. In similar fashion the line segment AC represents a range of voltages ΔV apart at time X1, while the line segment BD represents the same voltage range at time X2. The four vertices A, B, C and D form a closed figure, and within certain limits we are entitled to attribute to it certain properties, as is done by the chart in FIG. 6. There ARE limits, however, such as signals whose time variant traces have points of inflection that lie within the figure formed by the vertices. So, for example, a signal that crosses CD from outside the box ABCD, changes direction and goes back out again by re-crossing CD from inside, will not detected as having encountered the box. There are a number of such circumstances, and they amount to the well known situation where high speed phenomena are often inaccurately described by slow speed sampling.

To continue in this vein, we note that "crossing" a vertical line segment (such as AC), where "crossing" means there was an occurrence of ANY voltage on the line segment at the time of interest, CAN INDEED be detected as a combination of terms. However, the particular hardware we have shown does not actually do the exact corresponding thing for horizontal lines: "Was the signal EVER at this voltage during this time interval?" Hardware to do that can be contemplated, and amounts to appreciating: (1) That "at this voltage" means "equals"; (2) That there is an attending practical issue of tolerance that the pure mathematical conception of equality does not require, with the implication that for a given resolution it is a range of voltages that is actually being detected, and not an EXACT voltage; and (3) That the amount of time spent at the voltage of interest might correspond to a point an not an interval.

Now, if there WERE an "equals comparator" that possessed exactitude and tolerated zero duration to boot, we would simply arrange for its output (if there were one) to "latch-up" during the time interval of interest. But there are no comparators, and probably never will be, that REALLY do the "equals" comparison. Without such a comparator we are unable to accomplish the stated task. Instead, actual comparators for analog quantities respond to a range if they are "equality detectors," or else have $\leq$ or $\geq$ as their function (threshold comparison). One solution is to combine two threshold comparators to identify a small range taken to be the practical equivalent of a point. There remains the speed of operation issue concerning how fast things can be recognized and recorded. There is a similar set of philosophical observations concerning speed of operation, which we can omit as being familiar, and for which the usual solution is to restrict the dv/dt of the input signal to some limit that can be dealt with. Accordingly, we will henceforth assume that the input signal has been bandwidth limited to what can be dealt with by the available comparators and latches.

To return to the correct interpretation of the horizontal line segments, it is now fair to ask if they represent the revised question: "Was the signal EVER sufficiently close to a particular value during the time interval?" That is the most stringent question that we can expect our hardware to answer.

Putting all these ideas together, we arrive at a more informed position where we now ask only: "Was the input signal within a range of voltages during a certain interval of time?" The question is to be a practical one, and not an ideal one. Upon reflection, it will be appreciated that, for example, the BOUNDING BOX ABCD is a practical representation of such a range of voltage during an interval of time, and that while there are indeed limitations on what it means to "cross" AB, AB taken with CD is definitive, provided we accept the limitations of resolution. As physical beings in a physical universe we appear to have no physical access to the ideal of exact equality or to instantaneous behavior, and settle for close approximations. That is what we get if we make the BOUNDING BOX ABCD small enough, and then treat the BOUNDING BOX as a unit. Hence, we treat the entire combination of the latched states A', B', C' and D' as a unit outcome, and get on with the rest of our affairs. In other words, we can take a small enough BOUNDING BOX as a correct substitute for not being able to tell if a signal's value "really" crossed a horizontal line during an interval: we let the BOUNDING BOX act in place of the line and rely on there being two parallel horizontal lines in the BOUNDING BOX whose presence gets us off the exactitude hook, as it were. Bandwidth limiting of the input signal and fast sampling take care of the speed issue.

So, one way to use the circuitry of FIG. 5 is to make the BOUNDING BOX ABCD a small rectangle, and then vary VOFF and TOFF to move it around through a (time, voltage) plane or space as desired. For example, in an EDA application, the size of the BOUNDING BOX would be selected according to the user's resolution requirements, and it would be left to dwell at various locations (values for VOFF and TOFF) for appropriate amounts of time, and the number of HITs recorded, etc.

If we are prepared to add more comparators and/or clock signals, we can add more vertices to a BOUNDING BOX to provide more terms that can be applied to the DETECTION LOGIC. For example, the side of a BOUNDING BOX could have a staircase shape.

It is clear from the philosophical discussion above that vertices whose interconnecting lines are other than vertical or horizontal produce results that must be more loosely interpreted. For example, a line sloping up and to the right may mean only that the input was above one threshold at the start of a time interval and below a higher threshold at the end of that time interval. If there is to be continuity of the input signal (a reasonable belief), there will be a combination of terms that implies that the sloping line was crossed, but we have no idea of when within the interval, or at what voltage within the difference of the two thresholds.

Another way to use the BOUNDING BOX is to make it large, say, so that it just fits inside what is expected to be a proper eye description. Now it can function as an eye violation detector that also indicates, in general, how any violations occurred.

In conclusion, we consider some extensions to the ideas set out above. First, return to FIG. 5 and notice the optional ADVANCING DELAYs 57 and 58. If they are present, they allow the BOUNDING BOX DETECTOR to be "anchored" with respect to X1. So, if the ADVANCING DELAY is set to a value $\delta$ (and we assume here that $\delta$ is small; a fraction of a clock cycle), then the inputs to LATCHs A and C will represent locations in time earlier than X1, while LATCHs B and D continue to be clocked $\Delta$T after X1. Thus, $\delta$ could be set to a minimum set-up value, while $\Delta$T is set to a minimum hold value. In this way, with correct values for the RANGING OFFSETs and the appropriate logic function in the DETECTION LOGIC, we obtain a signal representing a Setup/Hold & Noise Margin Trigger, which we could also call a Clock-Centered Eye Violation Trigger.

Figure 7:
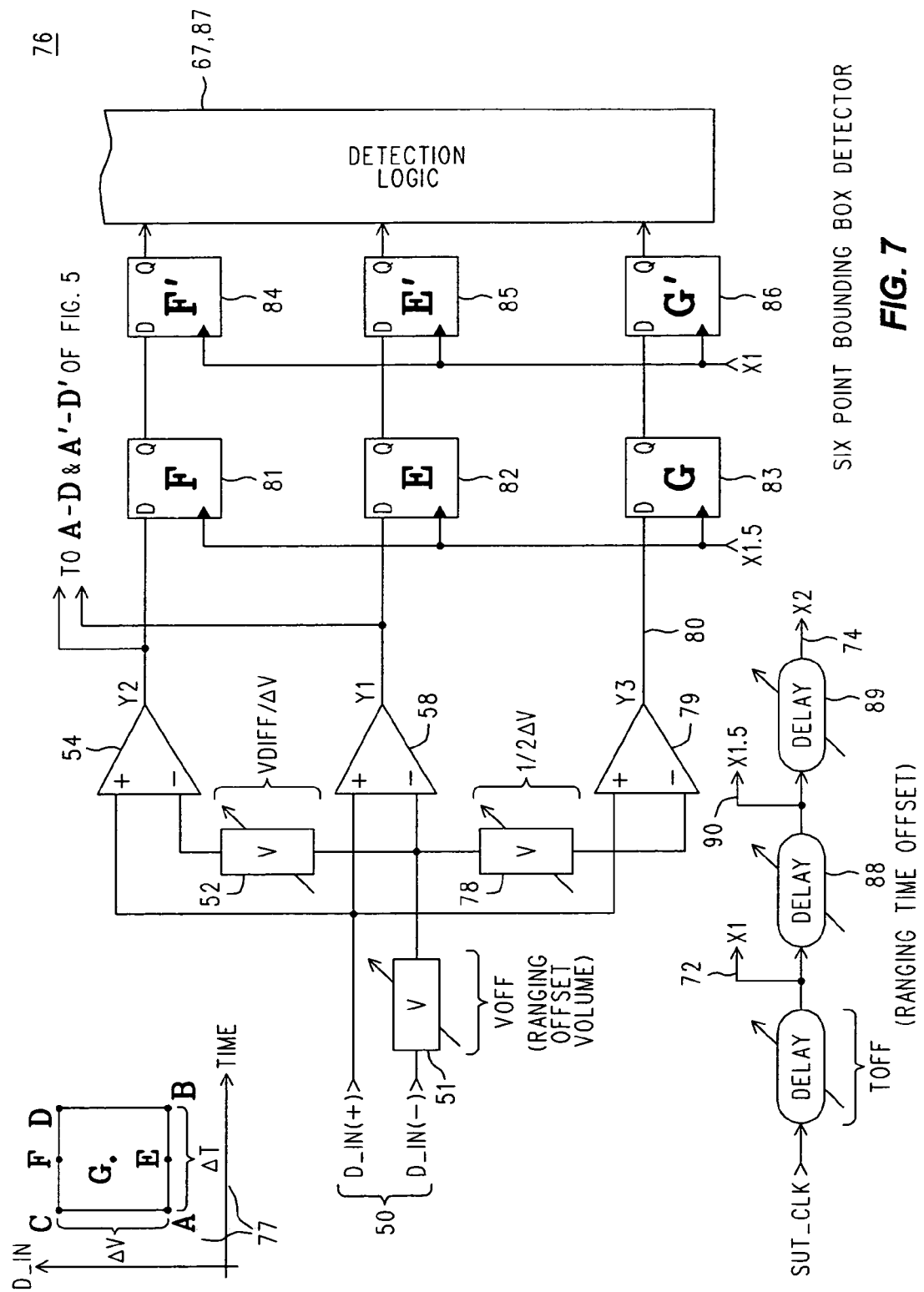
FIG. 7 is a simplified block diagram illustrating elements to be added to the block diagram of FIG. 5 to produce a six point BOUNDING BOX DETECTOR.

FIG. 7 illustrates an extension 76 to the block diagram 46 of FIG. 5. It adds the additional terms E, F and G, as indicated by the diagram 77. To this end, LATCHs E, F and G are clocked by an signal X1.5 (90) that is obtained by a DELAY circuit 88 driven by X1. The signal X1.5 occurs between instances of X1 and X2. The signal X2 continues to be where it was, but is now produced by another (shorter) DELAY circuit 89. X1 is used to clock LATCHs E, F and G into LATCHs E', F' and G'. LATCHs E and F are responsive to voltage comparisons Y1 and Y2, just as are LATCHs A and C, respectively. LATCH G is responsive to a new term Y3 representing a threshold that is, for example, one half of VDIFF or $\Delta$V/2. The DETECTION LOGIC (formerly 67, now 87) is, of course, augmented to deal with the additional terms E', F' and G'. It will be noted that G' can be taken as the logical value of the signal D_IN that existed at the time corresponding to each of the other terms A'-F'. Also, it is clear that the six-point BOUNDING BOX (76 with 46) with terms A' through G' can be understood as a unit on its own, or as two individual four-point BOUNDING BOXs AECF and EBFD that share EGF as a common side.

We claim:

1. A method of characterizing a work signal's behavior during a time interval, the method comprising the steps of:
   (a) defining a time interval by START and END timing signal transitions;
   (b) comparing the work signal to a first threshold voltage to produce a logical first comparison value;
   (c) comparing the work signal to a second threshold voltage to produce a logical second comparison value;
   (d) capturing as a first term the logical first comparison value upon an occurrence of the START transition;
   (e) capturing as a second term the logical second comparison value upon an occurrence of the START transition;
   (f) capturing as a third term the logical first comparison value upon an occurrence of the END transition;
   (g) capturing as a fourth term the logical second comparison value upon an occurrence of the END transition; and
   (h) producing at least one characterization signal indicative of the occurrence in the first through fourth terms of a selected combination thereof.

2. A method as in claim 1 wherein the START and END transitions are transitions in separate signals produced by delaying the active edge of a clock signal, and further comprising the step of capturing the first through fourth terms as buffered first through fourth terms upon the occurrence of the START transition, and further wherein step (h) operates upon the buffered first through fourth terms.

3. A method as in claim 2 wherein a characterization signal produced by step (h) represents that the work signal was rising at about the time of the START transition.

4. A method as in claim 2 wherein a characterization signal produced by step (h) represents that the work signal was rising at a time between the START and END transitions.

5. A method as in claim 2 wherein a characterization signal produced by step (h) represents that the work signal was rising at about the time of the END transition.

6. A method as in claim 2 wherein a characterization signal produced by step (h) represents that the work signal was falling at about the time of the START transition.

7. A method as in claim 2 wherein a characterization signal produced by step (h) represents that the work signal was falling at a time between the START transition and END transitions.

8. A method as in claim 2 wherein a characterization signal produced by step (h) represents that the work signal was falling at about the time of the END transition.

9. A method as in claim 2 wherein a characterization signal produced by step (h) represents that the work signal was essentially quiet between the START and END transitions.

10. A method as in claim 2 wherein the START and END transitions and the first and second threshold voltages have been selected to represent a desired eye opening and a characterization signal produced by step (f) represents that the work signal entered that desired eye opening.

11. A method as in claim 1 wherein the comparisons in steps (b) and (c) are each delayed after the START transition by selected amounts.

12. A method as in claim 1 further comprising the steps of:
   (i) producing a MIDDLE timing signal transition between the occurrence of the START and END transitions;
   (j) comparing the work signal to a third threshold voltage that is between the first and second threshold voltages to produce a logical third comparison value;
   (k) capturing as a fifth term the logical third comparison value upon an occurrence of the MIDDLE transition; and
   (l) wherein step (h) is further responsive to the fifth term.

* * * * *